United States Patent [19]
Horiguchi et al.

[11] Patent Number: 5,955,896
[45] Date of Patent: Sep. 21, 1999

[54] INPUT BUFFER USING A DIFFERENTIAL AMPLIFIER

[75] Inventors: Masashi Horiguchi, Kawasaki; Jun Etoh, Hachioji; Takeshi Sakata, Kunitachi; Kan Takeuchi, Kodaira; Katsumi Matsuno, Kokubunji; Masakazu Aoki, Higashi-tokorozawi, all of Japan

[73] Assignee: Hitachi, Ltd., Tokyo, Japan

[21] Appl. No.: 08/606,852

[22] Filed: Feb. 26, 1996

Related U.S. Application Data

[63] Continuation of application No. 08/386,456, Feb. 10, 1995, abandoned.

[30] Foreign Application Priority Data

Mar. 3, 1994 [JP] Japan .................................. 6-033305

[51] Int. Cl.$^6$ ................................................ H03K 5/20
[52] U.S. Cl. ................................................ 326/95; 326/83
[58] Field of Search ........................ 326/95, 83, 84, 326/105; 365/189.05, 230.08

[56] References Cited

U.S. PATENT DOCUMENTS

| | | | |
|---|---|---|---|
| 3,757,310 | 9/1973 | Croxon ..................................... | 326/105 |
| 4,074,148 | 2/1978 | Sato ........................................... | 326/83 |
| 4,096,402 | 6/1978 | Schroeder et al. ....................... | 365/230 |
| 4,441,039 | 4/1984 | Schuster ................................... | 326/83 |
| 4,561,702 | 12/1985 | McAdams ................................. | 326/83 |
| 4,937,480 | 6/1990 | Higuchi et al. ........................... | 326/84 |

Primary Examiner—Michael J. Tokar
Assistant Examiner—Richard Roseen
Attorney, Agent, or Firm—Antonelli, Terry, Stout & Kraus, LLP

[57] ABSTRACT

In an input circuit for semiconductor devices, such as an address buffer, an arrangement is provided which obviates the timing margin from capture of an input signal to its latching and outputting, thereby increasing the operation speed of the input circuit. The address buffer includes a differential amplifier Ai which receives an input signal Ai and outputs a pair of differential signals A-come-first-served latch circuit detects, latches and outputs one of the paired differential signals that has changed first. Activation/inactivation of the differential amplifier is done by turning on and off an N-channel MOS transistor through a Set signal. When activated, the differential amplifier generates a potential difference between the paired differential signals and, when inactivated, has its paired differential signals go low.

38 Claims, 16 Drawing Sheets

INPUT BUFFER USING A DIFFERENTIAL AMPLIFIER

This is a continuation of application Ser. No. 08/386,456, filed Feb. 10, 1995 now abandoned.

BACKGROUND OF THE INVENTION AND SUMMARY OF THE INVENTION

The present invention relates to an input circuit for semiconductor devices and more specifically to an input circuit suited for high-speed operation of semiconductor devices such as memories.

A circuitry of a conventional address buffer commonly employed for dynamic random access memories (DRAMs) is shown in FIG. 14(a). The address buffer in general is inserted between an address input signal and a decoder or pre-decoder so as to level and latch input signals.

Referring to FIG. 14(a), reference numerals 91, 94, 95 represent NAND gates, numerals 92, 96, 97 inverters, and 93 a D-latch. The conventional address buffer of such configuration takes in an address input signal Ai through the NAND gate 91 and inverter 92, latches it in the D-latch 93 and outputs internal address signals BiT, BiB through the NAND gates 94, 95 and inverters 96, 97. Designated $\phi1$, $\phi2$, $\phi3$ are signals that specify capture, latch and output timings, respectively. The D-latch 93 outputs the state at the input D as is when the enable input E is high and, when E is low, retains the previous state. This latch may, for example, be formed by a circuit shown in FIG. 14(b).

The operation of this conventional address buffer is described by referring to operation waveforms shown in FIG. 15. During a standby state, i.e., when a row-address-strobe signal $\overline{RAS}$ is high, the signals $\phi1$ and $\phi3$ are low and the signal $\phi2$ is high. Hence, because one of two N-channel MOS transistors forming the NAND gate 91 is cut off, a DC current does not flow, whether the address input signal Ai is high or low. Further, because the signal $\phi3$ is low, both the output signals BiT, BiB are low.

When during operation the row-address-strobe signal $\overline{RAS}$ goes low, the signal $\phi1$ goes high first to capture the address input signal Ai. At this point, the signal $\phi2$ is still high, so that the input to the D-latch 93 appears as is at the output. Because the signal $\phi3$ is low, the output signals BiT, BiB remain low. Then, the signal $\phi2$ becomes low to latch the captured signal and at the same time the signal $\phi3$ goes high causing one of the output signals BiT, BiB to go high. After this, if the input signal Ai changes, the output signals BiT, BiB do not change because the previously captured input signal is latched in the D-latch 93. When $\overline{RAS}$ returns to a high level, the signals $\phi1$, $\phi2$, $\phi3$ return to their original levels, causing the output signals BiT, BiB to go low.

This conventional address buffer is suited as an address buffer for DRAMs in the following two points. First, because a DC current does not flow while in standby, as mentioned above, the address buffer consumes little power. Second, during the standby state, the output signals BiT, BiB are both low. During operation, the output signals BiT, BiB are complementary, that is, one is high and the other is low, causing a decoder to select one word line or bit line. During the standby, however, both of the output signals BiT, BiB are low to deselect all word lines or bit lines. DRAMs in particular require that the word lines be deselected or in a non-selected state during standby to retain stored information. This operation of the conventional address buffer is suited for DRAMs.

A circuit of a conventional pre-decoder used in DRAMs is shown in FIG. 16. Pre-decoding is to decode a part of an input signal for the decoder beforehand. Because pre-decoding reduces the number of fan-ins in the logic gate of the decoder, the use of a pre-decoder is effective in reducing the number of elements in the input logic gate of the decoder. In the case of a 10-bit address decoder, for instance, it requires a 10-input logic gate if pre-decoding is not performed whereas pre-decoding two bits at a time reduces the number of inputs of the logic gate to five.

A pre-decoder 98 in FIG. 16 comprises four NAND gates and four inverters and produces four pre-decoded signals Cij0–Cij3 by combining two pairs of internal address signals (output signals of address buffer) BiT, BiB, BjT, BjB. During standby, the internal address signals are all low as mentioned above and all the pre-decoded signals are also low. During operation, one of paired internal address signals BiT and BiB and one of paired internal address signals BjT and BjB go high. According to the combination of the high internal address signals, only one of the pre-decoding signals Cij0–Cij3 is high with the remaining three at low level.

Literatures related to this art include the IEEE Journal of Solid-State Circuits, vol.SC-18, pp457–463, October 1983.

The above-mentioned address buffer and pre-decoder that form the input circuit of a DRAM are not suited to high-speed operation, as explained below.

First, explanation goes to the conventional address buffer shown in FIG. 14. This circuit requires a timing margin, as indicated by T in FIG. 15, between the signal $\phi1$ and the signals $\phi2$, $\phi3$ (signals $\phi2$ and $\phi3$ substantially coincide). This timing margin must be longer than a delay time which elapses from the moment the input is taken in by the signal $\phi1$ to the moment the captured input signal appears at the output of the D-latch 93. Further, because the delay time varies due to manufacturing process and temperature variations, a sufficient margin should be taken so as to prevent erroneous operation even in the worst case. When this margin is not sufficient, e.g., when the margin between the signals $\phi1$ and $\phi2$ is not enough, there is a possibility of an erroneous signal being latched. When the margin between the signals $\phi1$ and $\phi3$ is insufficient, there is a possibility of a false signal being output temporarily. When the address buffer is used to input an address for selecting a word line for DRAM, the latter case, in particular, results in a wrong word line being selected temporarily, destroying stored information. The necessity of this timing margin limits the operation speed of the conventional address buffer, giving rise to the problem that it is not suited to high-speed operation.

Next, the conventional pre-decoder shown in FIG. 16 is explained. While pre-decoding, as mentioned earlier, is effective in reducing the number of fan-ins of the decoder, it has a problem of generating a delay. In the pre-decoder of FIG. 16, for example, there is generated a delay corresponding to two stages of logic gate.

It is an object of the present invention to provide an input circuit for semiconductor devices which solves the above problem and is suited to high-speed operation.

To achieve the above objective, the input circuit for semiconductor devices according to this invention comprises a differential amplifier that outputs a pair of differential signals in response to an input signal; and a latch means that detects, latches and outputs one of the paired differential signals that has changed first.

It is possible to provide a plurality of such latch means and connect the paired differential signals commonly to the inputs of the plurality of latch means.

In the input circuit for semiconductor devices, if an address signal is used as an input signal and a pair of complementary internal address signals are used as an output of the latch means, this input circuit would form a preferred address buffer. It is further preferred to provide the differential amplifier with an activate/inactivate means that performs, in response to the set signal, an activation whereby a potential difference is generated between the paired differential signals and an inactivation whereby the paired differential signals are made equal in potential. The activate/inactivate means may be formed in such a way as to turn on and off the power of the differential amplifier.

Further, the input circuit for semiconductor devices is characterized in that it has a plurality of differential amplifiers, each of which outputs a pair of differential signals in response to an input signal, and that it has at least a latch means which receives the plurality of pairs of differential signals and which detects, latches and outputs one of decoded sets of differential signals that has changed first. In this input circuit for semiconductor devices, too, it is preferred that the differential amplifiers each be provided with an activate/inactivate means, which performs an activation operation to generate a potential difference between the paired differential signals and an inactivation operation to make the potentials of the paired differential signals equal.

Further, it is possible to provide a plurality of sets of the differential amplifier and the latch means, the differential amplifier being adapted to output a pair of differential signals in response to an input signal, the latch means being adapted to detect, latch and output one of the paired differential signals that has changed first. It is also possible to provide a means which activates and inactivates each of the differential amplifiers in response to an input signal for each set supplied in a multiplexed mode to a common input terminal of the differential amplifiers of all the sets. It is preferred that the signal supplied to the differential amplifiers be made an address-multiplexed signal and that the output of each latch means be made a pair of complementary internal address signals.

The input circuit for semiconductor devices according to the present invention may also comprise a differential amplifier which outputs a pair of differential signals in response to an address input signal; an address counter which has a means to convert an input into a pair of complementary signal outputs; a mode switch means that switches between a normal operation mode for enabling the paired outputs from the differential amplifier and a refresh mode for enabling the paired outputs from the counter; and a latch means which receives the paired outputs from the differential amplifier and the paired outputs from the counter, latches one of the paired outputs enabled by the mode switch means that has changed first, and then outputs a pair of complementary internal address signals.

With the input circuit for semiconductor devices of the present invention, when the differential amplifier that outputs a pair of differential signals in response to an input signal is activated by a set signal from the activate/inactivate means, a potential difference is generated between the paired differential signals according to the input signal. The latch means, which takes in the pair of differential signals, detects one of the paired differential signals that has changed first and latches it. That is, the latch means requires no special timing signal for latching because it automatically performs the latch operation according to a change in the input signal. Thus, there is no need to provide a timing margin between the input capture by the differential amplifier and the latching, as is required in the conventional art, resulting in higher operation speed.

The input circuit for semiconductor devices, in which the paired differential signals from the differential amplifier are commonly fed to the plurality of latch means, can perform as a preferable address buffer for address-multiplexed DRAMs if the differential amplifier is supplied an address-multiplexed signal as its input.

Further, the latch means that receives a plurality of pairs of differential signals from a plurality of the above-mentioned differential amplifiers can incorporate a pre-decode function by being so configured as to detect one of decoded sets of differential signals that has changed first. Thus, it is not necessary to provide a separate pre-decoder, virtually eliminating a delay that would otherwise be caused by its logic gates, permitting high-speed operation.

When the differential amplifier is inactivated by the activate/inactivate means, the differential signals assume the same potential and at the same time the latch circuit is reset. If the power of the differential amplifier is turned on or off by the activate/inactivate means, when the power is turned off the output level of the input circuit becomes low and no DC current flows, realizing a low power consumption.

It is also possible to add a refresh function to the address buffer without increasing the number of logic gate stages if the input circuit for semiconductor devices comprises a differential amplifier which outputs a pair of differential signals in response to an address input signal; an address counter which has a means to convert an input to a pair of complementary signal outputs; a mode switch means to switch, as by a SetR signal and a SetX signal, between a normal operation mode for enabling the paired outputs from the differential amplifier and a refresh mode for enabling the paired outputs from the counter; and a latch means which receives the paired outputs from the differential amplifier and the paired outputs from the counter, latches one of the paired outputs enabled by the mode switch means that has changed first, and then outputs a pair of complementary internal address signals.

DETAILED DESCRIPTION OF THE INVENTION

By referring to FIGS. 1 to 13, the input circuit for semiconductor devices according to the present invention will be described in detail. The following embodiments concern the case where this invention is applied to an input circuit for address signals (a so-called address buffer) and particularly to an address buffer for a memory LSI.

Embodiment 1

Figure 1:
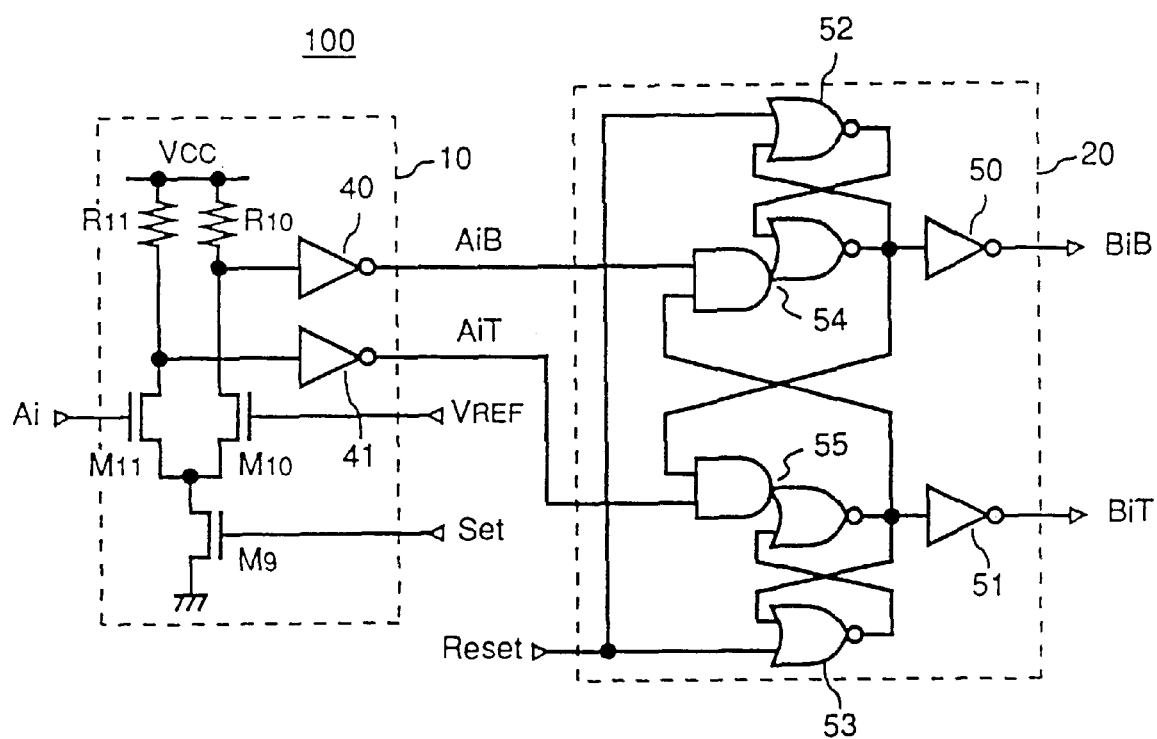
FIG. 1 is a circuitry of an address buffer as one embodiment of the input circuit for semiconductor devices according to this invention.

One embodiment of an input circuit for semiconductor devices according to this invention will be explained by referring to FIGS. 1 to 4. FIG. 1 is a circuitry showing the configuration of an address buffer as a first embodiment of this invention. In the figure, reference numeral 100 represents an address buffer, which comprises a differential amplifier 10 and a latch circuit 20. The differential amplifier 10 comprises N-channel MOS transistors $M_9$–$M_{11}$, resistors $R_{10}$, $R_{11}$ and inverters 40, 41 to compare an address input signal Ai with a reference voltage $V_{REF}$. The latch circuit 20 comprises inverters 50, 51, NOR gates 52, 53 and AND-NOR composite gates 54, 55, and detects and latches one of paired input signals AiT and AiB that has become high first (the latch circuit operating in this manner is hereinafter called a first-come-first-served latch circuit). The address buffer 100 is characterized in that the differential amplifier 10, which receives the address input signal Ai, outputs a pair of differential signals AiB, AiT to the input of the first-come-first-served latch circuit 20.

Figure 2A:
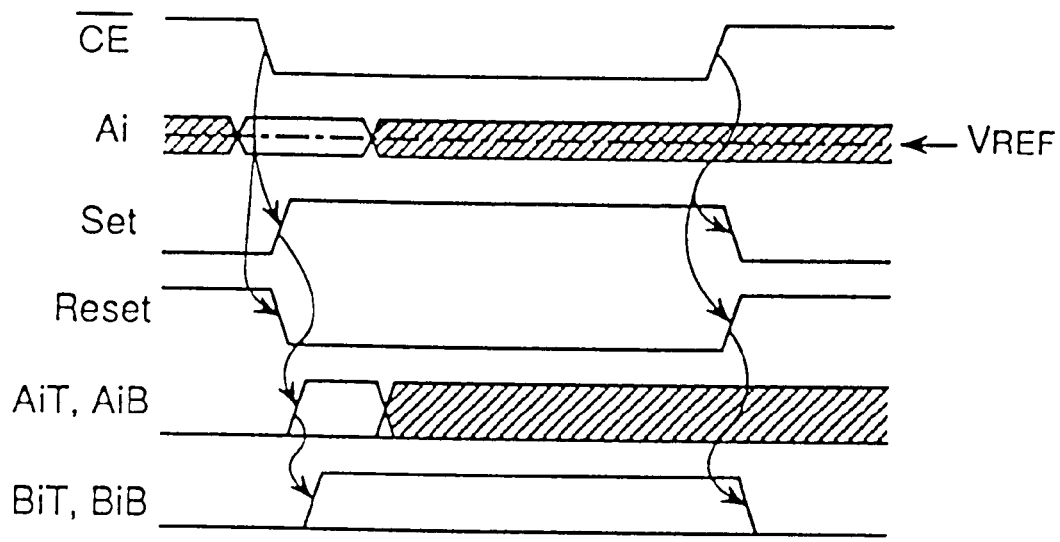
FIGS. 2(a) and 2(b) show one example of operation waveforms of the address buffer shown in FIG. 1.

Next, the operation of the address buffer 100 is explained by referring to operation waveforms shown in FIG. 2. FIG. 2(a) shows one example of operation waveforms of the address buffer 100. When a chip enable signal $\overline{CE}$ is high, a Set signal is low, which means that the N-channel MOS transistor $M_9$ is off holding the differential amplifier 10 inactivated. In this state, the output signals AiT, AiB of the differential amplifier 10 are both low. Because the N-channel MOS transistor $M_9$ is off, no current flows in the differential amplifier 10 which is in a low power consumption state.

When the chip enable signal $\overline{CE}$ goes low, the Set signal goes high, turning on the transistor $M_9$, which in turn activates the differential amplifier 10. Depending on whether the address input signal Ai is higher or lower than the reference voltage $V_{REF}$, the differential amplifier 10 raises one of the output signals AiT, AiB and holds the other at low level. For example, when the potential of the address input signal Ai is higher than the reference voltage $V_{REF}$, the output signal AiT of the differential amplifier 10 goes high. At this time, the first-come-first-served latch circuit 20 detects, latches and outputs one of the signals AiT, Aib that has first become high. For instance, when the signal AiT goes high, the output signal BiT of the latch circuit 20 goes high whereas the other output signal BiB remains low. After this, if the address input signal Ai changes, the output signals AiT, AiB of the differential amplifier 10 change but the output signals BiT, BiB of the first-come-first-served latch circuit 20 do not change.

When the chip enable signal $\overline{CE}$ returns to high level, the Set signal goes low, turning off the transistor $M_9$, which inactivates the differential amplifier 10. At this time because a Reset signal goes high, the first-come-first-served latch circuit 20 is reset, holding both the output signals BiT, BiB low.

Figure 2B:
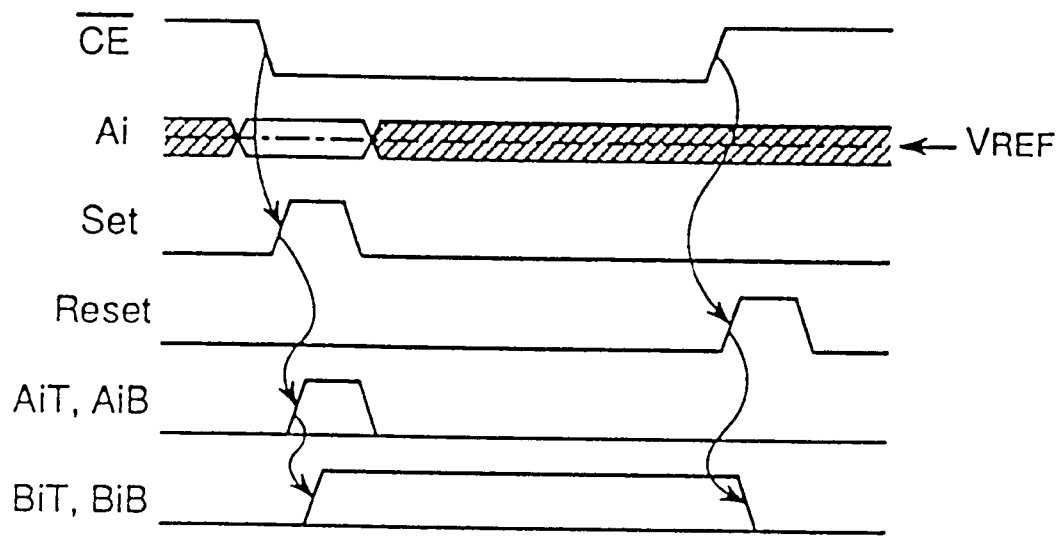

FIG. 2(b) shows another example of operation waveforms of the address buffer 100. What differs from the waveforms of FIG. 2(a) is that the Set signal and Reset signal go high only for a short duration immediately after the chip enable signal $\overline{CE}$ has changed. Because the time that the Set signal is high, i.e., the time in which the differential amplifier 10 is activated, is short, the address buffer 100 of this example has a smaller power consumption than that of FIG. 2(a).

Figure 15:
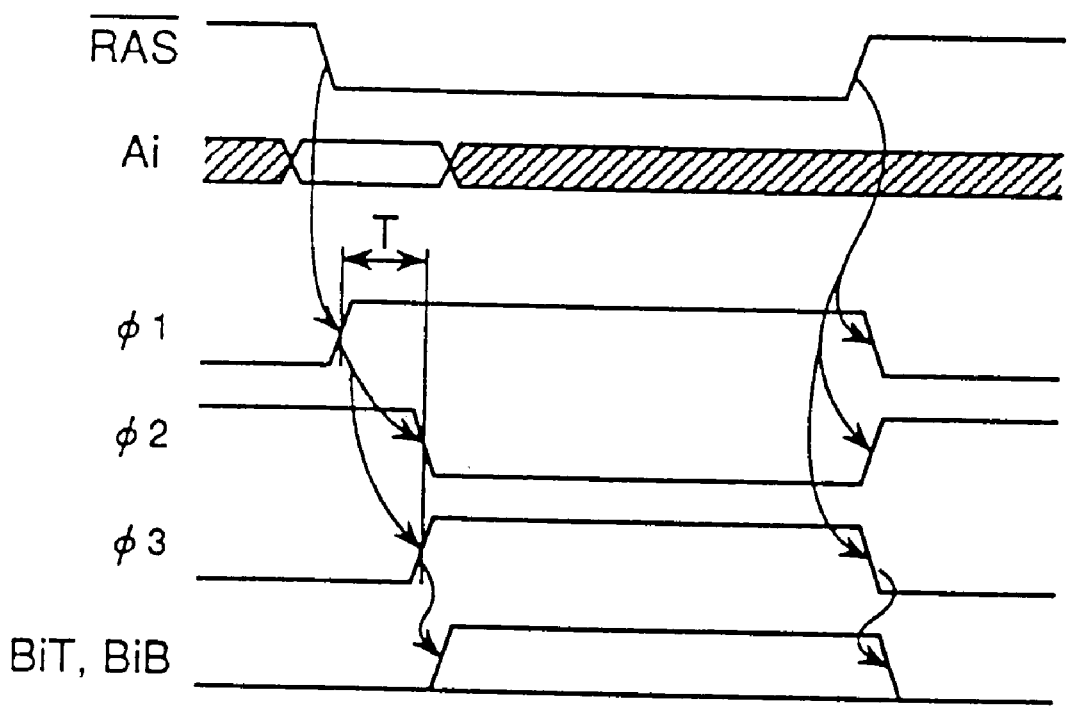
FIG. 15 is operation waveforms of the conventional address buffer shown in FIGS. 14(a) and 14(b)
Figure 16:
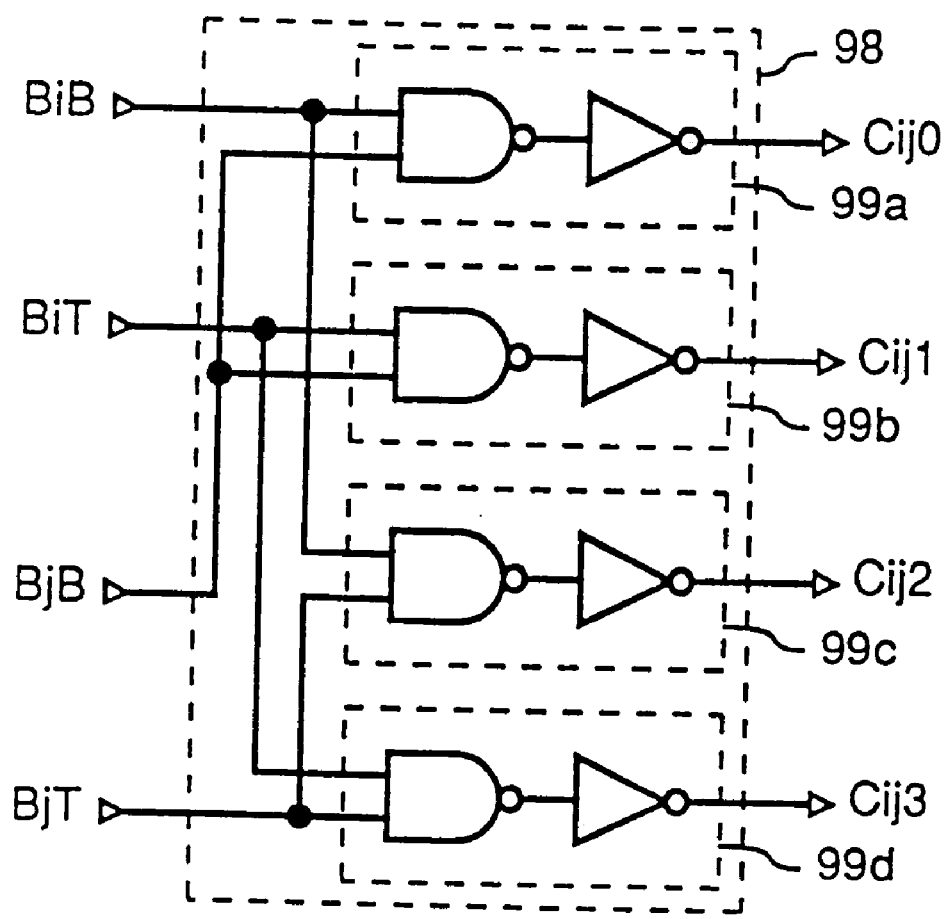
FIG. 16 is a circuitry of a conventional pre-decoder.

Comparison of the operation waveforms of FIG. 2(a) and 2(b) with that of FIG. 15 clearly shows the features of the address buffer 100 of this invention. That is, the address buffer 100 of this invention, though it has the Set signal equivalent to the conventional signal $\phi 1$, does not need signals corresponding to $\phi 2$ and $\phi 3$ signals. This is because the use of the first-come-first-served latch circuit 20 in the address buffer 100 of this invention allows latching and outputting to be automatically performed when signals AiT, AiB change. With the address buffer 100 of this embodiment, there is no need to provide a timing margin T (see FIG. 15) shown in the operation waveforms of the conventional address buffer, contributing to an increased operation speed. Further, the address buffer 100 of this invention retains two advantages of the conventional address buffer: (1) a DC current does not flow during standby (when the chip enable signal $\overline{CE}$ is high) reducing the power consumption and (2) during standby both the output signals BiT, BiB are low.

The circuit configuration of the differential amplifier 10 used in the address buffer 100 of this invention is not limited to that shown in FIG. 1. For example, it is possible to use differential amplifiers 10-1, 10-2 of circuit configurations shown in FIG. 3(a) and 3(b). In the case of the differential amplifier 10-1 of a configuration shown in FIG. 3(a), current mirror circuits made up of P-channel MOS transistors $M_{16}$, $M_{17}$ and $M_{18}$, $M_{19}$ are loads connected to differential circuits comprising N-channel MOS transistors $M_{12}$, $M_{13}$ and $M_{14}$, $M_{15}$. This increases a load impedance, offering an advantage of a large amplification factor. P-channel MOS transistors $M_{20}$, $M_{21}$ serve to hold the input terminals of the inverters 40, 41 at high level when the Set signal is low. An N-channel MOS transistor $M_9$ is used as a means to activate/inactivate the differential amplifier 10-1 according to the Set signal, as in the case of FIG. 1.

Figure 3A:
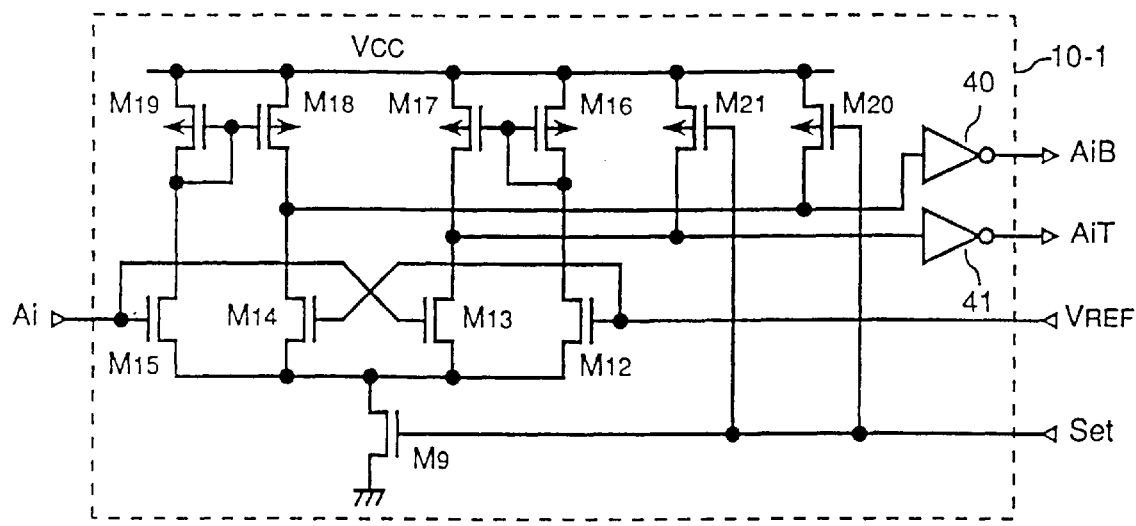
FIGS. 3(a) and 3(b) are circuitry arrangements showing another configuration of a differential amplifier used in the address buffer of FIG. 1.
Figure 3B:
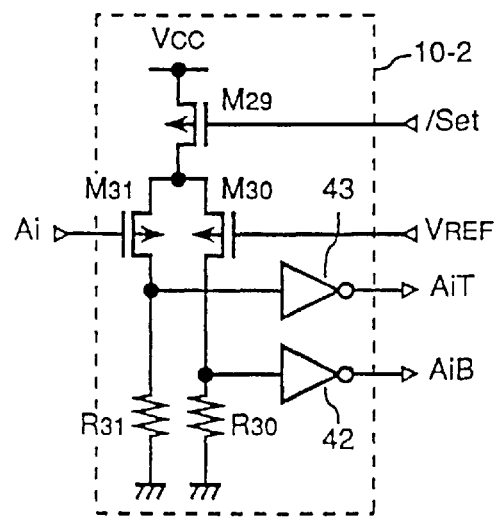
Figure 4:
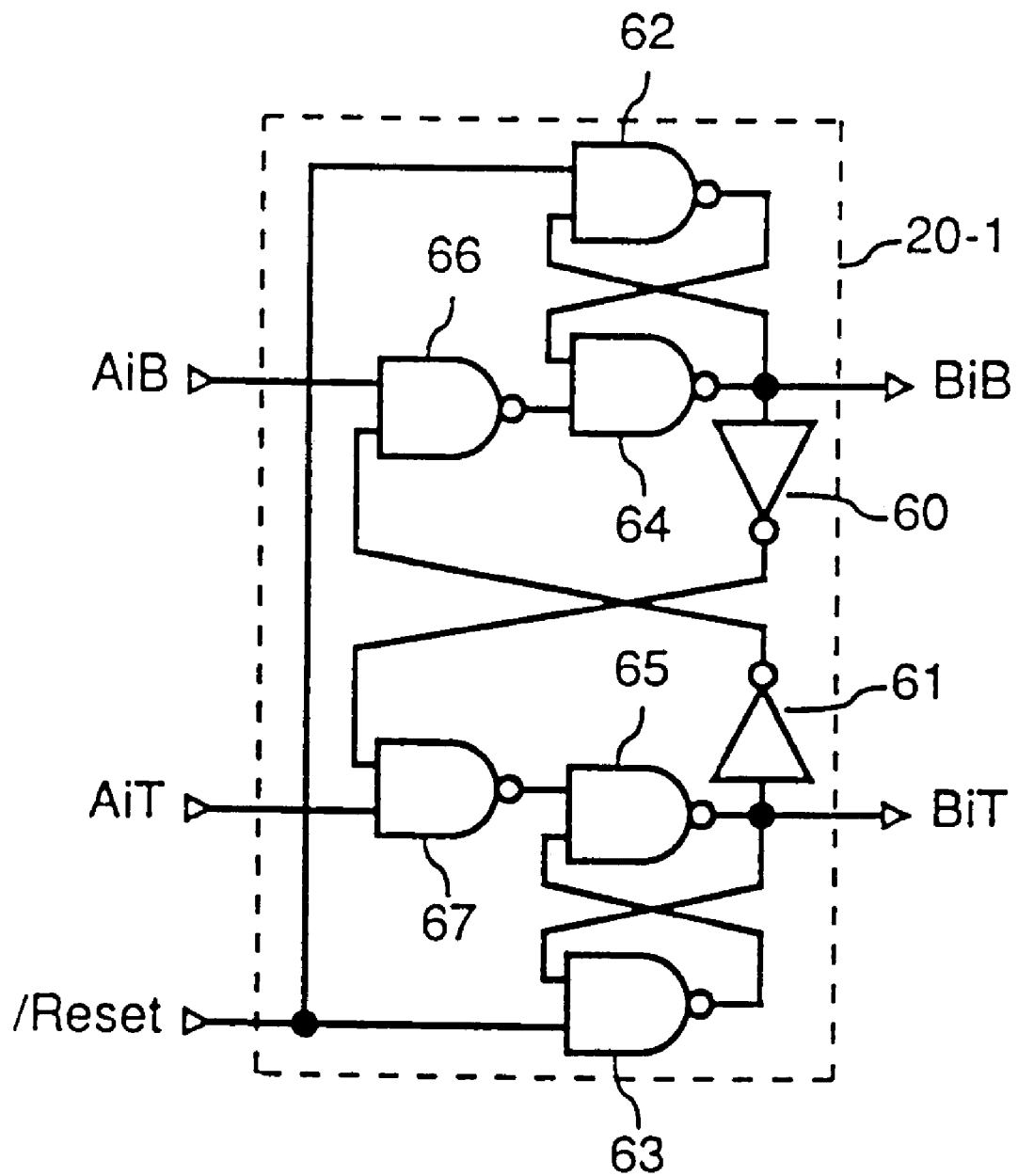
FIG. 4 is a circuitry showing another configuration of a first-come-first-served latch circuit used in the address buffer of FIG. 1.

The differential amplifier 10-2 shown in FIG. 3(b) is connected between a power source Vcc line and the ground and comprises a series circuit of a P-channel MOS transistor $M_{29}$ for activating/inactivating the differential amplifier according to the $\overline{Set}$ signal, a differential pair of P-channel MOS transistors $M_{30}$, $M_3$, and resistors $R_{30}$, $R_{31}$ constituting a load of each transistor of the differential pair. The differential amplifier 10-2 produces its output signals AiT, Aib from each load resistor $R_{30}$, $R_{31}$ through inverters 42, 43. The differential amplifier 10-2 has a circuit configuration with polarity inverted from the circuit of FIG. 1. Hence, the logic of the Set signal is inverted (the differential amplifier is activated when the $\overline{\text{Set}}$ signal is low) and both the output signals AiT, AiB go high when the differential amplifier 10-2 is inactivated. Thus, the first-come-first-served latch circuit 20 connected to this differential amplifier needs some modification, which is readily implemented, as by connecting one stage of inverter to each input of the first-come-first-served latch circuit 20.

The first-come-first-served latch circuit 20 may be formed in other configurations than that shown in FIG. 1. For example, it is possible to use a first-come-first-served latch circuit 20-1 shown in FIG. 4. This circuit comprises only NAND gates 62–67 and inverters 60, 61 but it is easily understood that this is equivalent in logic to the circuit of FIG. 1. In making a semiconductor device using the CMOS process, NAND gates are easier to fabricate and have smaller areas than NOR gates and therefore the circuit configuration of FIG. 4 has the advantage of being more suited to the CMOS process than that of FIG. 1.

Further, the reference voltage $V_{REF}$ for the differential amplifier 10 may either be produced within the semiconductor device or applied from external circuits. Alternatively, the input signal Ai and the reference voltage $V_{REF}$ may not be distinguished and instead be supplied as a pair of differential signals. The method of applying the reference voltage $V_{REF}$ from outside and the method of entering the paired differential signals are suited where small-amplitude input signals are received, as described in the IEEE Spectrum, October 1992, pp.54–57.

Embodiment 2

Figure 5:
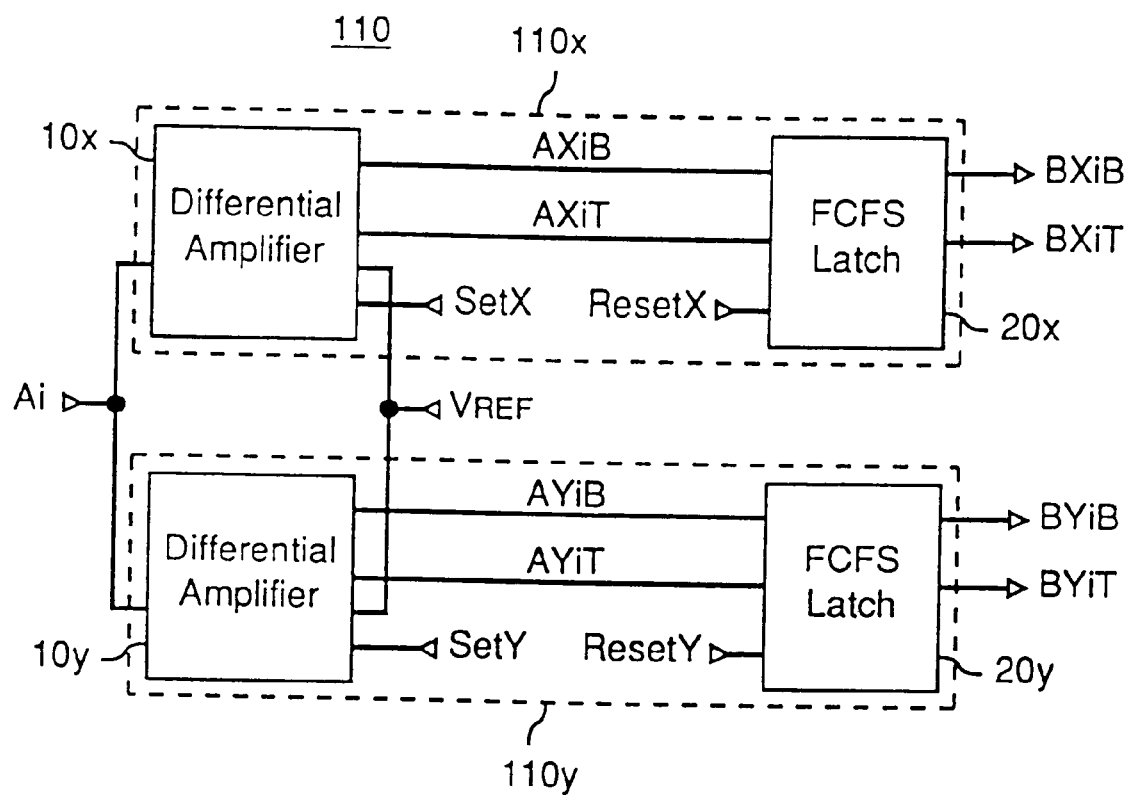
FIG. 5 is a circuitry of an address buffer as a second embodiment of the input circuit for semiconductor devices according to this invention.

A second embodiment of the input circuit for semiconductor devices according to this invention is described by referring to FIG. 5, which shows the configuration of an address buffer 110 of this invention as applied to an address-multiplexed DRAM. In the address multiplexing, a row address and a column address are supplied time-division multiplexed from the same input terminal Ai. Hence, the address buffer 110 of this embodiment comprises two sets of circuits—a row address buffer 110x made up of a differential amplifier 10x and a first-come-first-served latch circuit 20x, and a column address buffer 110y made up of a differential amplifier 110y and a first-come-first-served latch circuit 20y. Reference symbols SetX and ResetX designate set and reset signals for the row address; and SetY and ResetY denote set and reset signals for the column address. These set signals activate/inactivate the differential amplifiers 10x, 10y according to the input of column address and row address, and the first-come-first-served latch circuits 20x, 20y during operation each produce a pair of complementary signals. When the latch circuits are reset by the reset signals, both of the paired complementary outputs of each latch circuit go low. Outputs BXiT, BXiB of the first-come-first-served latch circuit 20x are internal row address signals and outputs BYiT, BYiB of the first-come-first-served latch circuit 20y are internal column address signals.

Because the address buffers 110x, 110y use the first-come-first-served latch circuits 20x, 20y, respectively, the latching and outputting is automatically performed in the row address buffer 110x when the output signals AXiT, AXiB of the differential amplifier 10x change and in the column address buffer 110y when the output signals AYiT, AYiB of the differential amplifier 10y change. Thus, in this embodiment, too, the timing margin required by the conventional address buffer configuration becomes unnecessary, permitting high-speed operation, as in the first embodiment.

Embodiment 3

Figure 6A:
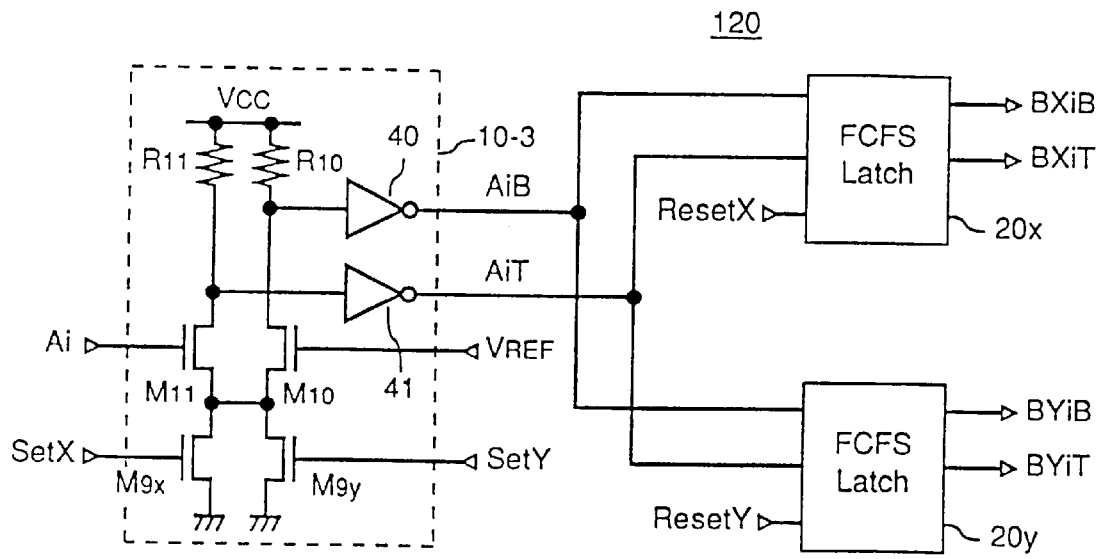
FIGS. 6(a) and 6(b) show a third embodiment of the input circuit for semiconductor devices of this invention, with FIG. 6(a) representing an address buffer and FIG. 6(b) representing another example of the first-come-first-served latch circuit for row address used in the address buffer of (a)
Figure 6B:
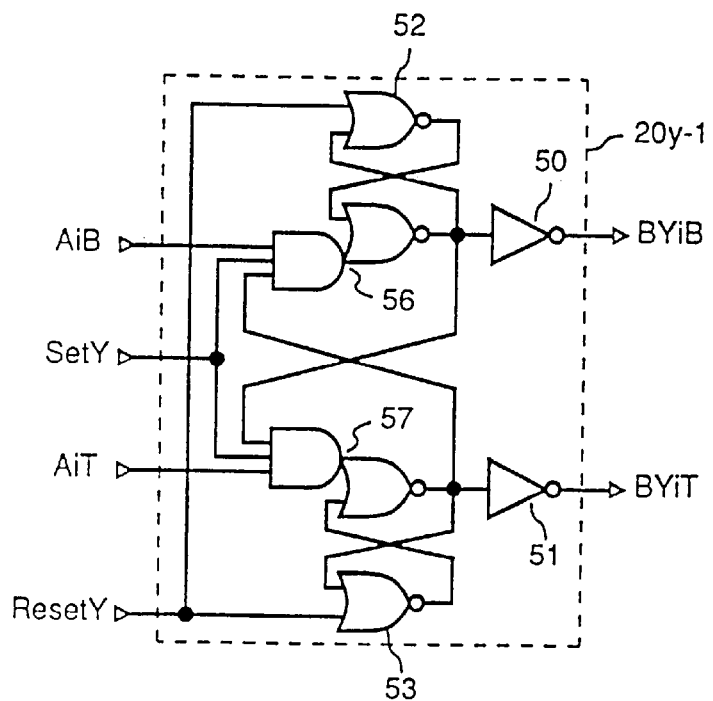
Figure 7:
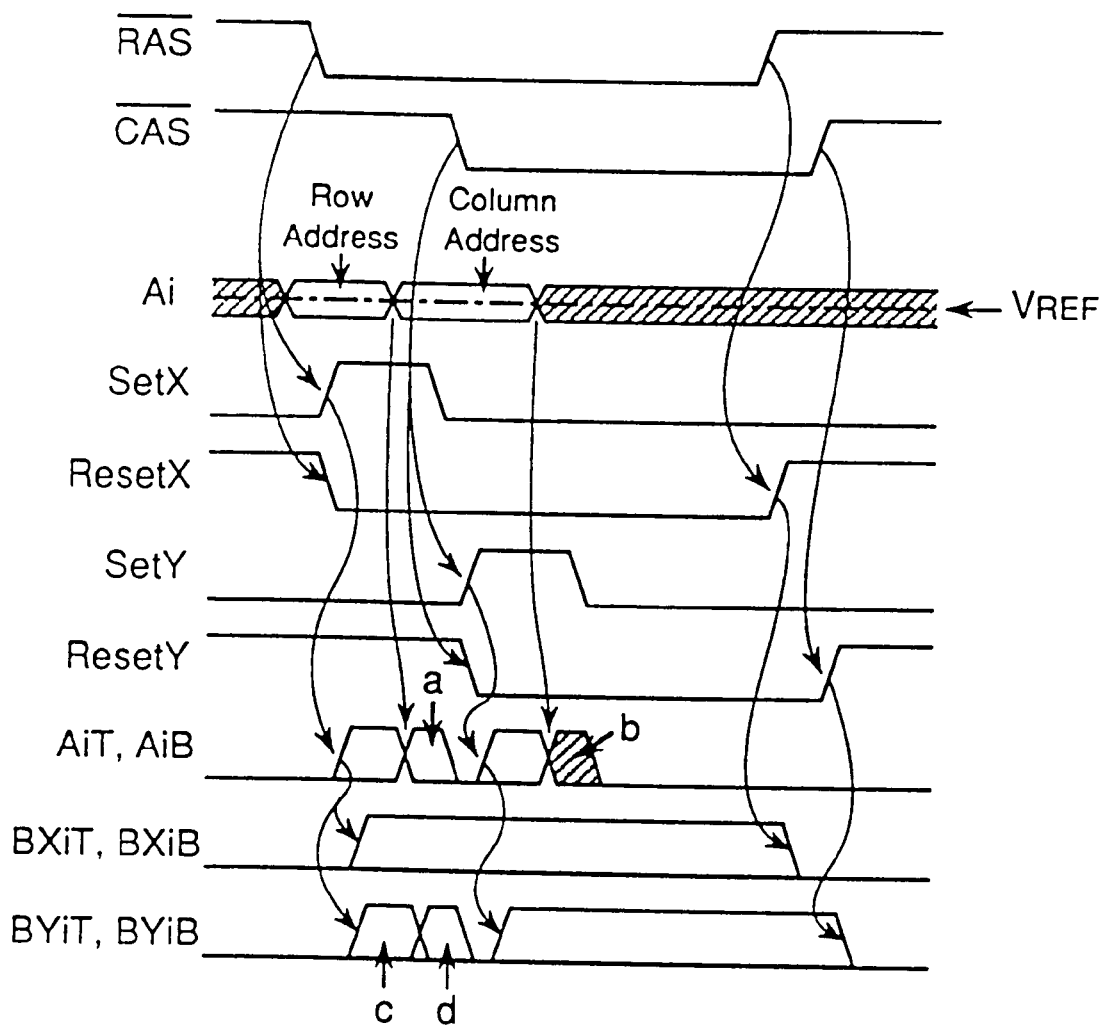
FIG. 7 is operation waveforms of the address buffer of FIG. 6.

A third embodiment of the input circuit for semiconductor devices according to this invention is described by referring to FIGS. 6 and 7. FIG. 6(a) shows the configuration of an address buffer 120 of this invention, as applied to an address-multiplexed DRAM. Unlike the second embodiment, this address buffer uses the differential amplifier 10-3 both for row address and column address to save space and power consumption. The circuit configuration of the differential amplifier 10-3 differs from that of FIG. 1 in that the parallelly connected N-channel MOS transistors $M_{9x}$, $M_{9y}$ are used in place of the N-channel MOS transistor $M_9$. This arrangement activates the differential amplifier 10-3 when at least one of SetX and SetY is high.

By referring to operation waveforms of FIG. 7, the operation of the address buffer 120 is explained. When an row-address-strobe signal $\overline{\text{RAS}}$ goes low, SetX goes high activating the differential amplifier 10-3. Thus, the differential amplifier 10-3 holds one of the output signals AiT, AiB high depending on whether the address input signal Ai (it is assumed that the row address is set) is higher or lower than the reference voltage $V_{REF}$. The first-come-first-served latch circuit 20x for row address detects, latches and outputs one of the output signals AiT, AiB of the differential amplifier 10-3 that has become high first. For instance, when the signal AiT goes high, the output signal BXiT of the first-come-first-served latch circuit 20x goes high and the output signal BXiB remains low. After this, when the address input signal Ai changes, the output signals AiT, AiB of the differential amplifier 10-3 change as shown by the arrow a in FIG. 7 but the output signals BXiT, BXiB of the first-come-first-served latch circuit 20x do not change. When the SetX signal returns to the low level, the N-channel MOS transistor $M_{9x}$ turns off (at which time the SetY signal remains low and the N-channel MOS transistor $M_{9y}$ is also off), inactivating the differential amplifier 10-3.

Next, when the column-address-strobe signal $\overline{\text{CAS}}$ goes low, the SetY signal goes high activating the differential amplifier 10-3 again, which in turn holds one of the output signals AiT, AiB high depending on whether the address input signal Ai (it is assumed this time that the column address is set) is higher or lower than the reference voltage $V_{REF}$. The first-come-first-served latch circuit 20y for column address detects, latches and outputs one of the output signals AiT, AiB of the differential amplifier 10-3 that has become high first. When, for example, the output signal AiT goes high, the output signal BYiT of the first-come-first-served latch circuit 20y goes high with the output signal BYiB remaining low. After this, if the address input signal Ai changes, the output signals AiT, AiB of the differential amplifier 10-3 change as shown by the arrow b in FIG. 7 but the output signals BYiT, BYiB of the first-come-first-served latch circuit 20y do not change. When the SetY signal returns to low level, the N-channel MOS transistor $M_{9y}$ turns off (at which time the SetX signal remains low and the N-channel MOS transistor $M_{9x}$ is also off), inactivating the differential amplifier 10-3 again.

When the row-address-strobe signal $\overline{\text{RAS}}$ returns to high level, the ResetX signal goes high causing the outputs of the first-come-first-served latch circuit 20x for the row address to return to low level. When the column-address-strobe signal $\overline{\text{CAS}}$ returns to high level, the ResetY signal goes high causing the outputs of the first-come-first-served latch circuit 20y for the column address to return to low level.

In this embodiment, the merit of using the first-come-first-served latch circuit is more obvious. That is, at the instant that the first-come-first-served latch circuit 20x takes in a row address, the ResetY signal is still high, so that the output signals BYiT, BYiB of the first-come-first-served latch circuit 20y for column address change as shown by the arrows c, d in FIG. 7 but the latch operation is not executed. Conversely, when the first-come-first-served latch circuit 20y takes in a column address, the first-come-first-served latch circuit 20x for the row address is already in the latched state, so that the outputs of the latch circuit 20x are not affected by changes in the output signals AiT, AiB of the differential amplifier 10-3. Therefore, the sharing of the differential amplifier 10-3 by two latch circuits does not result in erroneous operation. Needless to say, in this embodiment too, the timing margin required by the conventional address buffer configuration is rendered unnecessary, contributing to higher operation speed.

If it is not desired that false signals such as indicated by the arrows c, d in FIG. 7 appear in the output signals BYiT, BYiB of the first-come-first-served latch circuit 20y, the latch circuit 20y may be modified into a first-come-first-served latch circuit 20y-1 shown in FIG. 6(b), in which the SetY signal and the inputs AiB and AiT are ANDed. In other words, in the first-come-first-served latch circuit 20 of FIG. 1, a two-input AND gate making up the AND-NOR composite gates 54, 55 is replaced with a three-input AND gate with a third input of the SetY signal which makes up AND-NOR composite gates 56, 57. This arrangement prevents erroneous operations which may otherwise be caused by false signals and also reduces power consumption which is required for charging and discharging parasitic capacitance at the output end of the BYiT, BYiB of the first-come-first-served latch circuit 20y-1 for column address.

Embodiment 4

Figure 8:
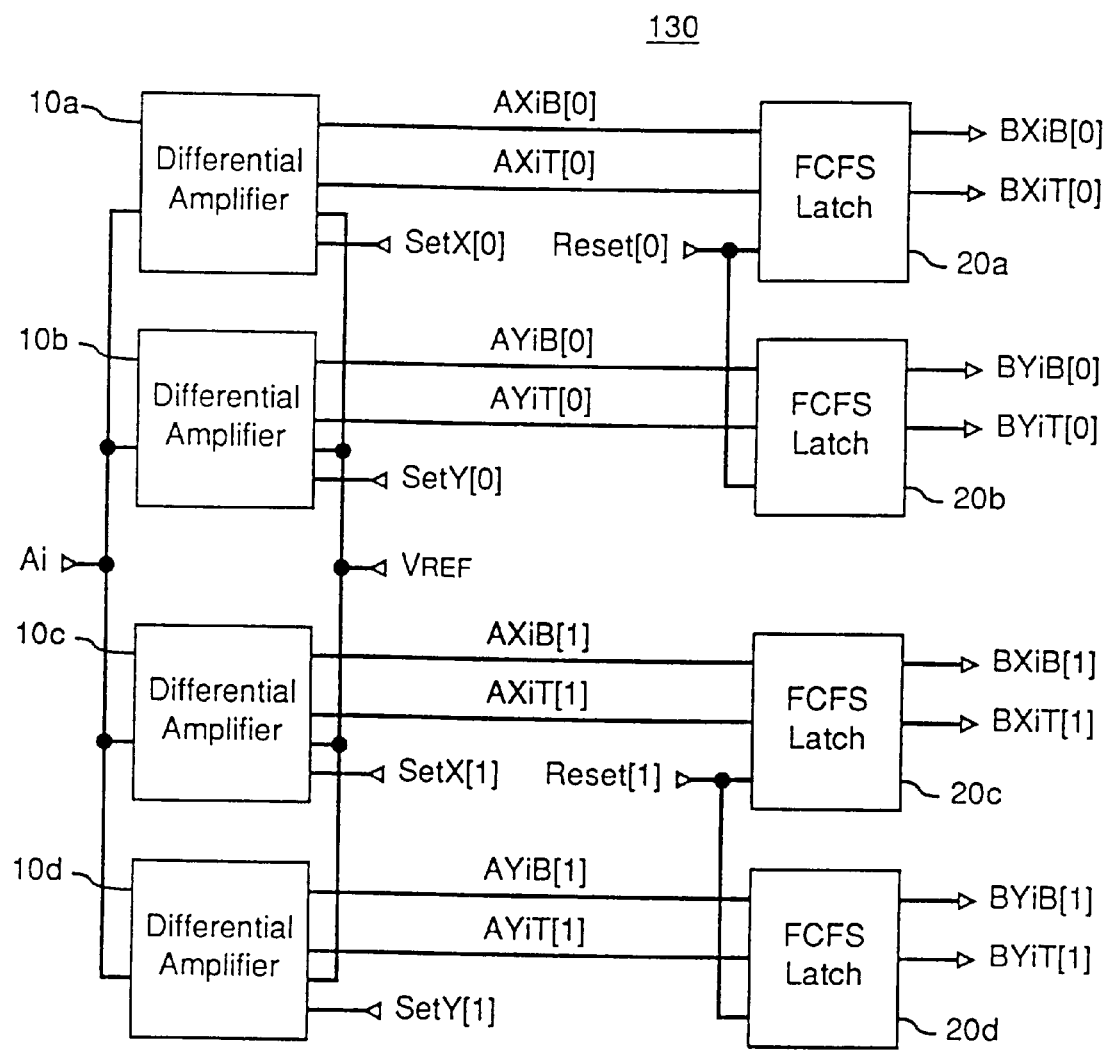
FIG. 8 is a circuitry of an address buffer as a fourth embodiment of the input circuit for semiconductor devices according to this invention.
Figure 9:
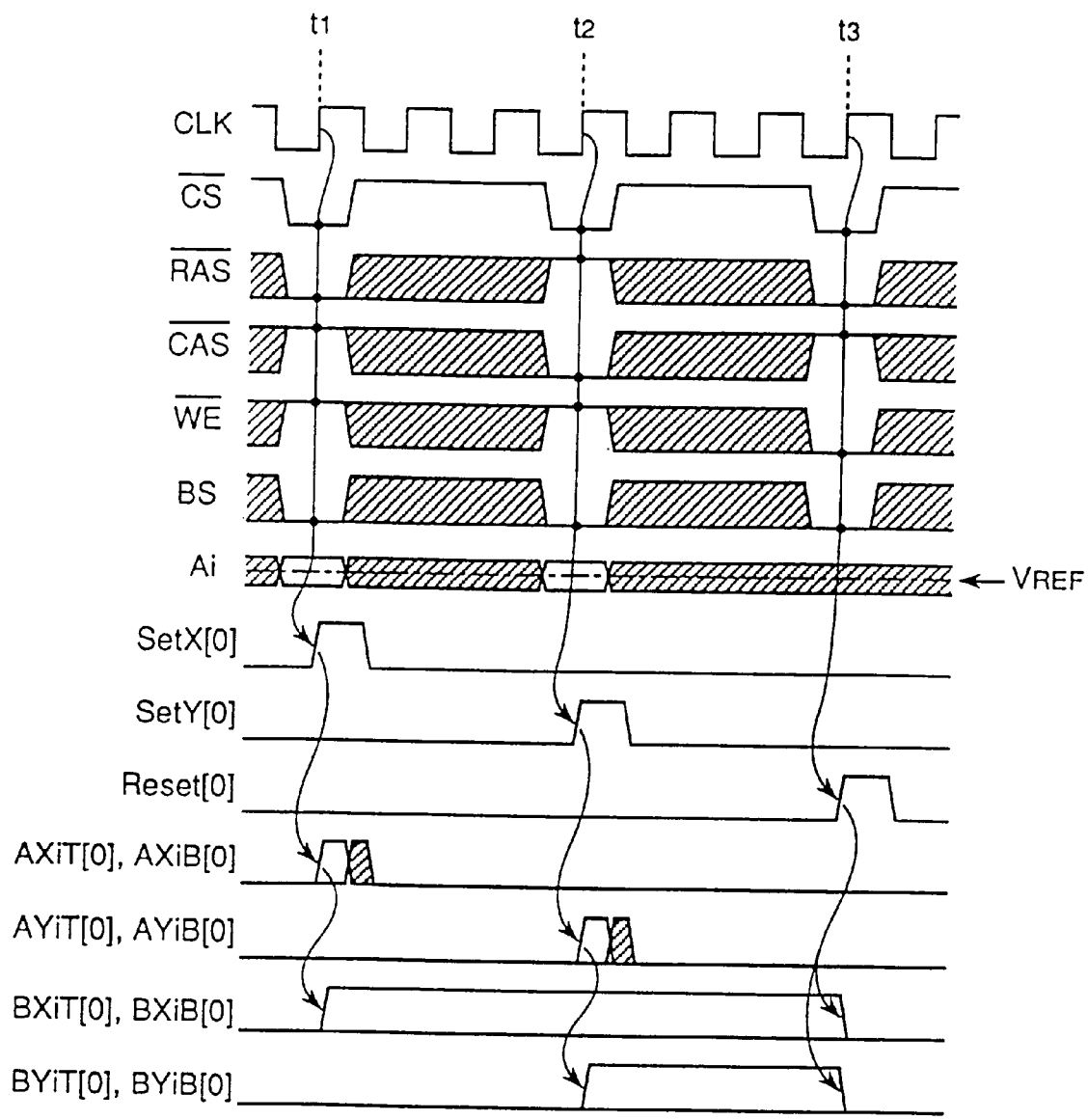
FIG. 9 is operation waveforms of the address buffer shown in FIG. 8.

A fourth embodiment of the input circuit for semiconductor devices according to this invention is described by referring to FIGS. 8 and 9. FIG. 8 shows the configuration of an address buffer 130 of this invention, as applied to a synchronous DRAM, which takes in addresses and outputs data in synchronism with clocks. Details of the DRAM are described in the following literatures.

(1) IEEE Spectrum, October 1992, pp.43–49; and
(2) Nikkei Electronics, May 11, 1992 issue, page 143–147.

The synchronous DRAM usually has two banks that are independently accessible. This embodiment provides two circuits for each bank, one for row address and one for column address, and therefore a total of four circuits for two banks. A differential amplifier 10a and a first-come-first-served latch circuit 20a form a bank 0 for row address; a differential amplifier 10b and a first-come-first-served latch circuit 20b form a bank 0 for column address; a differential amplifier 10c and a first-come-first-served latch circuit 20c form a bank 1 for row address; and a differential amplifier 10d and a first-come-first-served latch circuit 20d form a bank 1 for column address. In the figure the character [i] in signal names denotes a bank number i.

Now, the operation of the address buffer 130 of the above configuration is explained by referring to operation waveforms shown in FIG. 9. In the synchronous DRAM, at the rising edge of a clock CLK, a command is specified by a combination of a chip select signal $\overline{CS}$, a row-address-strobe signal $\overline{RAS}$, a column-address-strobe signal $\overline{CAS}$, a write enable signal $\overline{WE}$ and a bank selection signal BS.

At time $t_1$, because the signals $\overline{CS}$ and $\overline{RAS}$ are low, $\overline{CAS}$ and $\overline{WE}$ are high and BS is low (specifying the bank 0), an activation command for bank 0 is specified. This holds a SetX[0] signal for bank 0 high, activating the differential amplifier 10a and the first-come-first-served latch circuit 20a. As a result, a row address is taken in from the address input terminal Ai, causing one of the internal row address signals BXiT[0] and BXiB[0] for bank 0 to go high.

Then at time $t_2$, because the signals $\overline{CS}$ and $\overline{CAS}$ are low, $\overline{RAS}$ and $\overline{WE}$ are high and BS is low, a read command for bank 0 is specified. This raises the SetY[O] signal for bank 0 to high level, activating the differential amplifier 10b and the first-come-first-served latch circuit 20b. As a result, a column address is taken in from the address input terminal Ai, causing one of the internal column address signals BYiT[0] and BYiB[0] for bank 0 to go high.

At time $t_3$, because the signals $\overline{CS}$, $\overline{RAS}$ and $\overline{WE}$ are low, $\overline{CAS}$ is high and BS is low, a precharge command for bank 0 is specified. This raises the Reset[0] signal for bank 0 to high level, resetting the first-come-first-served latch circuits 20a, 20b, which in turn cause BXiT[0], BXiB[0], BYiT[0] and BYiB[0] to go low.

Hence, this embodiment also obviates the timing margin from the capture of the input signal for the differential amplifiers to the latching and outputting by the first-come-first-served latch circuits, increasing the operation speed of the input circuit.

Embodiment 5

Figure 10:
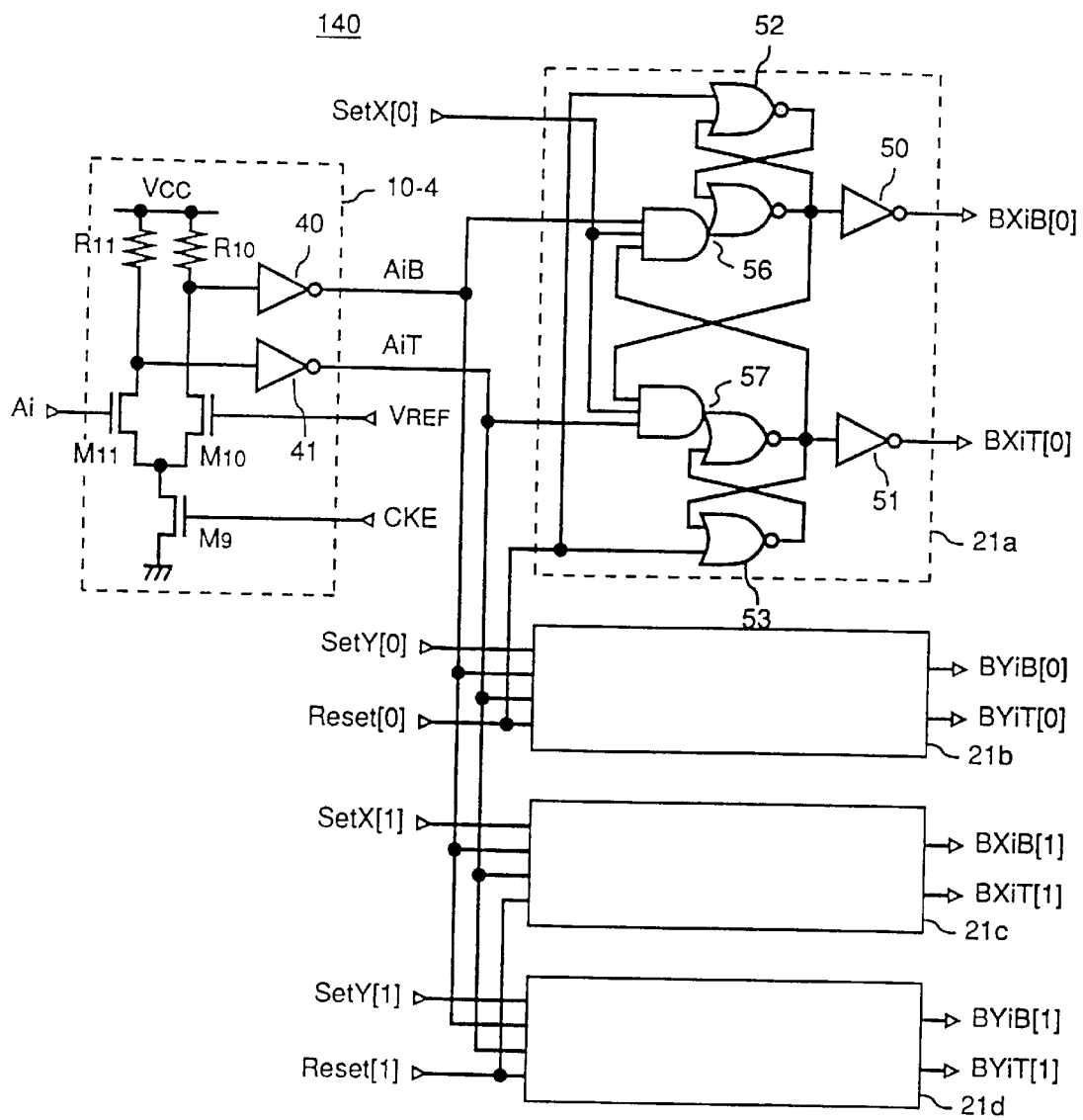
FIG. 10 is a circuitry of an address buffer as a fifth embodiment of the input circuit for semiconductor devices according to this invention.
Figure 11:
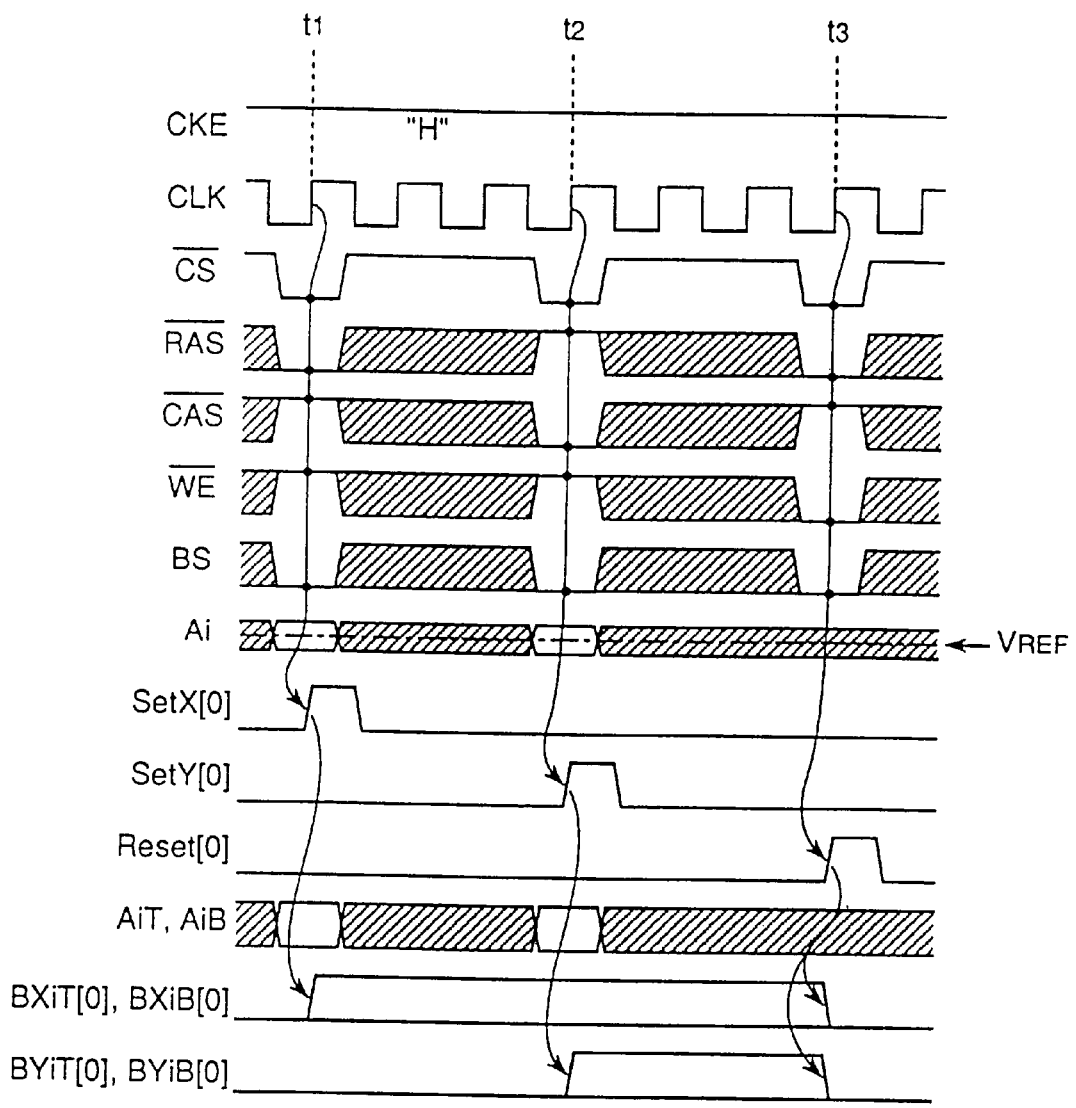
FIG. 11 is operation waveforms of the address buffer shown in FIG. 10.

A fifth embodiment of the input circuit for semiconductor devices according to this invention is described by referring to FIGS. 10 and 11. FIG. 10 shows the configuration of an address buffer 140 of this invention and FIG. 11 illustrates operation waveforms of the address buffer 140. This embodiment represents an application of the invention to an address buffer for a synchronous DRAM where, as in the third embodiment of FIG. 6, the differential amplifier is shared. A differential amplifier 10-4 is shared between the row address and column address for bank 0 and bank 1, so that the address buffer occupies a smaller area. The differential amplifier 10-4 is similar in configuration to the differential amplifier 10 of FIG. 1, except that it uses a different signal input to the gate of the N-channel MOS transistor $M_9$. That is, the differential amplifier 10-4 is activated by a CKE signal, which indicates that the clock CLK is enabled. The CKE signal is high at all times during operation, as shown in FIG. 11, so that the differential amplifier 10-4 is always activated. First-come-first-served latch circuits 21a–21d, which latch signals appearing at the outputs AiT and AiB of the differential amplifier 10-4 in synchronism with respective Set signals, employ the same circuit configuration as FIG. 6(b). The operation of this embodiment at times $t_1$, $t_2$, $t_3$ shown in the waveform diagram of FIG. 11 is similar to that of the fourth embodiment, and thus its detailed explanation is omitted. This embodiment has the advantage that because the number of logic gate stages from the Set signal to the internal address signal is smaller than that of the address buffer in the fourth embodiment, the operation speed is increased to the extent that the delay time caused by the differential amplifier is eliminated.

Embodiment 6

Figure 12:
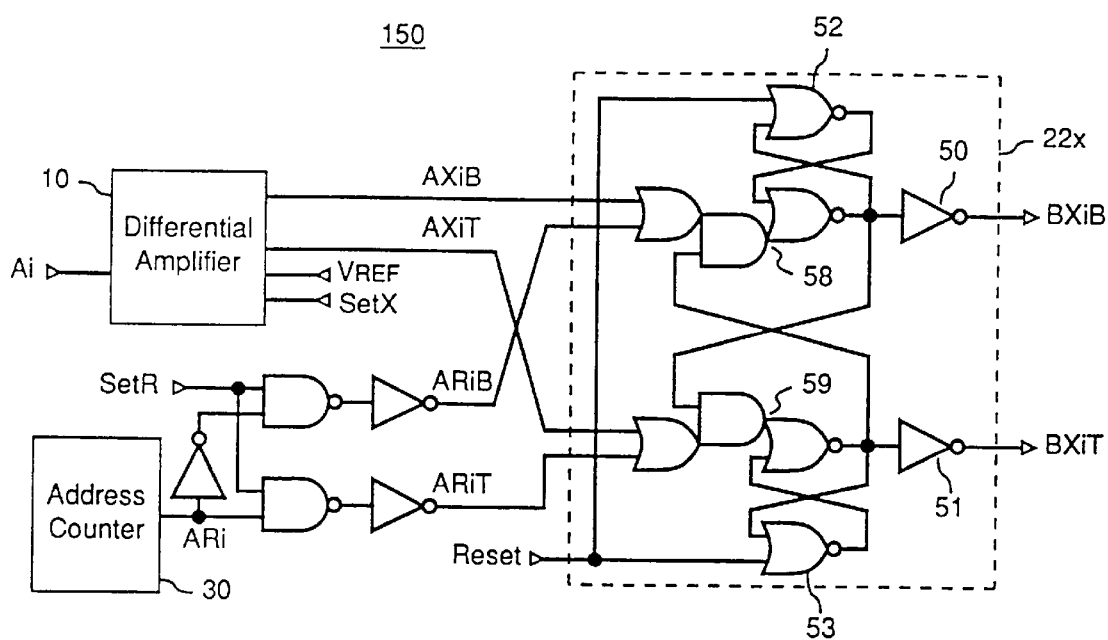
FIG. 12 is a circuitry of an address buffer as a sixth embodiment of the input circuit for semiconductor devices according to this invention.

A sixth embodiment of the input circuit for semiconductor devices according to this invention is explained by referring to FIG. 12. FIG. 12 shows the configuration of an address buffer 150 of this invention, as applied to a DRAM having a refresh function. In FIG. 12, reference numeral 30 represents an address counter, which stores a row address to be refreshed next. An output ARi of the address counter 30 is converted by a conversion circuit 31 made up of an inverter and NAND gates into a pair of complementary outputs ARiT, ARiB, which are further sent to a first-come-first-served latch circuit 22x for row address. The first-come-first-served latch circuit 22x for row address comprises inverters 50, 51, NOR gates 52, 53 and OR-AND-NOR composite gates 58, 59. A circuit for column address is not shown because it has the same configuration as that of FIG. 5 and can be formed using the circuit shown in FIG. 1.

During a normal operation mode, a SetR signal—a set signal for refreshing—is low and a SetX signal is high, so that both ARiT and ARiB are low and the operation of the address buffer 150 is similar to that of the second and third embodiments. In other words, the first-come-first-served latch circuit 22x automatically detects, latches and outputs one of the output signals AXiT, AXiB of the differential amplifier 10 that has first become high. Thus, in the normal operation mode, there is no need to provide the timing margin as is required in the conventional address buffer, making for an increased speed of operation as in the previous embodiments.

Conversely, during the refresh mode, the SetX signal is low at all times and the SetR signal is high. One of ARit and ARiB goes high according to the information stored in the address counter 30. The first-come-first-served latch circuit 22x detects one of the ARit and ARiB that has become high first and then latches and outputs it. That is, the information stored in the address counter 30 is output as the internal row address signals BXiT, BXiB. In this embodiment the switching between the normal operation mode and the refresh mode is done by SetX and SetR. It is possible to specify the refresh mode by applying a signal from outside or by performing a known $\overline{CAS}$-before-$\overline{RAS}$ control.

Comparison of the configuration of FIG. 12 with those of FIG. 5 and 6 shows that a refresh address generating function can be added without increasing the number of logic gate stages.

Embodiment 7

Figure 13:
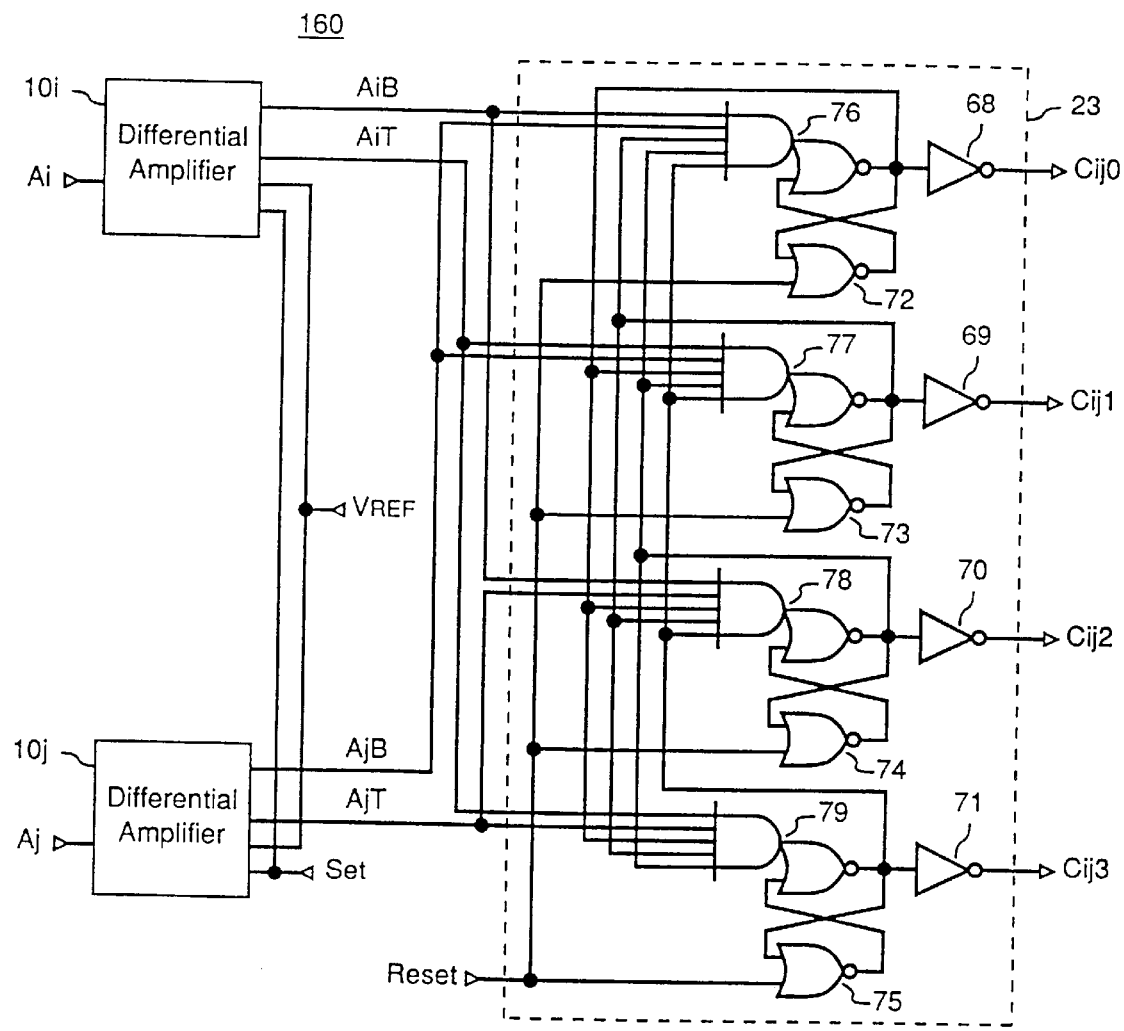
FIG. 13 is a circuitry of an address buffer as a seventh embodiment of the input circuit for semiconductor devices according to this invention.
Figure 14A:
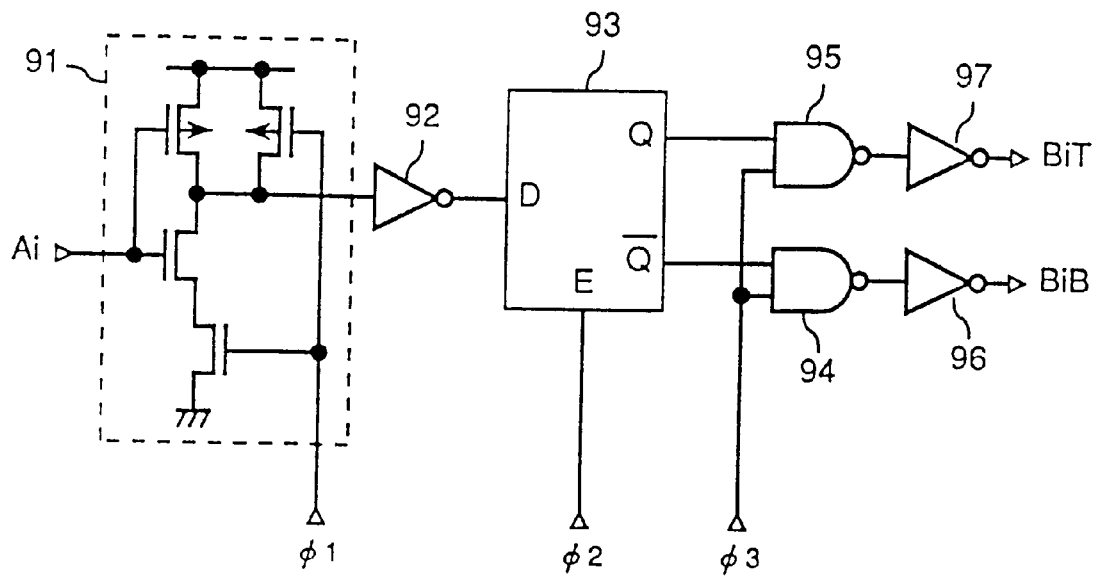
FIGS. 14(a) and 14(b) are circuity of a conventional address buffer.
Figure 14B:
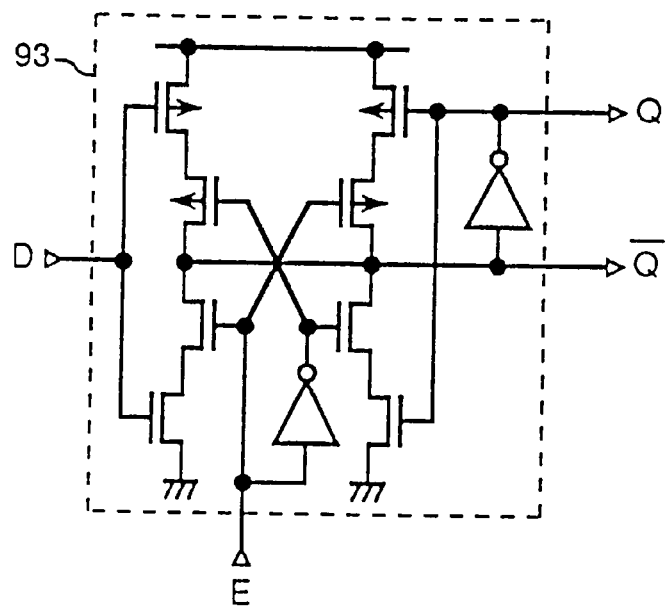

A seventh embodiment of the input circuit for semiconductor devices according to this invention will be described by referring to FIG. 13. FIG. 13 illustrates the configuration of an address buffer 160 of this invention. The address buffer 160 of this embodiment represents a case where a first-come-first-served latch circuit 23 is provided with a decode function. The first-come-first-served latch circuit 23 comprises AND-NOR composite gates 76–79, NOR gates 72–75 and inverters 68–71 and, in response to two pairs of output signals AiB, AiT, AjB, AjT from two differential amplifiers 10i, 10j, detects, latches and outputs one of these decoded sets of signals that has changed first. For example, when AiB and AjB go high, only Cij0 goes high, with Cij1–Cij3 remaining low. When AiT and AjB go high, only Cij1 goes high with Cij0, Cij2 and Cij3 remaining at low level. When the Reset signal goes high, Cij0–Cij3 all go low.

Comparison between the address buffer 160 of FIG. 13 and the address buffer 100 of FIG. 1 shows that the decode function is added to the address buffer 160 without increasing the number of logic gate stages. Hence, there is no need to provide a pre-decoder separately from the address buffer, as is required with the conventional art, so that a gate delay due to insertion of the pre-decoder is virtually eliminated, making it possible to increase the operation speed.

This embodiment can be applied not only to decoding of address signals but also to decoding of other signals. For instance, in the above-mentioned synchronous DRAM, a variety of commands can be specified by using a combination of $\overline{CS}$, $\overline{RAS}$ and $\overline{CAS}$ signals. The use of the circuit of this embodiment as a command decoder is advantageous for increasing the operation speed of the synchronous DRAM.

In the foregoing, we have described embodiments of the input circuit for semiconductor devices, as applied in particular to address buffer circuits of memory LSIs. It should be noted that the present invention is not limited to these embodiments but various modifications may be made without departing from the spirit of the invention. For example, this invention can also be applied to circuits for inputting data and other signals as well as to input circuits for semiconductor devices other than memory LSIs, such as those for microprocessors.

As is evident from the above-mentioned embodiments, the input circuit for semiconductor devices according to this invention comprises a differential amplifier, which outputs a pair of differential signals in response to an input signal, and a first-come-first-served latch circuit, which detects, latches and outputs one of the paired differential signals that has changed first, so that the timing margin from capture of the input signal to its latching and outputting is obviated, increasing the operation speed of the input circuit. Furthermore, during standby, the input circuit of the invention retains the advantages of the conventional circuits that a DC current does not flow reducing the power consumption and that the paired latch output signals are both low, while at the same time realizing an increased operation speed of the input circuit.

What is claimed is:

1. An interface circuit for semiconductor devices comprising:
    a differential amplifier that outputs a pair of differential signals and changes the potential of one of said pair of differential signals in response to an input signal; and
    a latch means that detects one of said pair of differential signals that has changed first, and latches and outputs the detected signal,
    wherein the differential amplifier has an activation/inactivation means which performs an activation operation to generate a potential difference between said pair of differential signals and an inactivation operation to make the potentials of said pair of differential signals equal.

2. An interface circuit for semiconductor devices according to claim 1, wherein the input signal is an address input signal, and the output of the latch means is a pair of complementary internal address signals.

3. An interface circuit for semiconductor devices according to claim 1, wherein the activation/inactivation means is a means for turning on and off power of the differential amplifier.

4. An interface circuit for semiconductor devices according to claim 1,
    wherein the differential amplifier changes the potential of said one of said pair of differential signals in response to said input signal without simultaneously changing the potential of said other of said pair of differential signals, and
    wherein said latch means detects and latches said one of said pair of differential signals without being supplied with any latch clock signals.

5. An interface circuit for semiconductor devices according to claim 4,
    wherein the latch means has a reset means which resets the data stored in the latch means and forces the output of the latch means to be a predetermined logical level.

6. An interface circuit for semiconductor devices according to claim 5, wherein the input signal is an address input signal, and the output of the latch means is a pair of complementary internal address signals.

7. An interface circuit for semiconductor devices comprising:
- a differential amplifier that outputs a pair of differential signals and changes the potential of one of said pair of differential signals in response to an input signal; and
- a plurality of latch means each of which detects one of said pair of differential signals that has changed first, and latches and outputs the detected signal,
- wherein the differential amplifier and the plurality of latch means are so connected and arranged that said pair of differential signals are commonly input to the plurality of latch means, and
- wherein the differential amplifier has an activation/inactivation means which performs an activation operation to generate a potential difference between said pair of differential signals and an inactivation operation to make the potentials of said pair of differential signals equal.

8. An interface circuit for semiconductor devices according to claim 7, wherein the input signal is an address input signal, and the output of the latch means is a pair of complementary internal address signals.

9. An interface circuit for semiconductor devices according to claim 7, wherein the activation/inactivation means is as means for turning on and off power of the differential amplifier.

10. An interface circuit for semiconductor devices according to claim 7,
- wherein the differential amplifier changes the potential of said one of said pair of differential signals in response to said input signal without simultaneously changing the potential of said other of said pair of differential signals, and
- wherein said latch means detects and latches said one of said pair of differential signals without being supplied with any latch clock signals.

11. An interface circuit for semiconductor devices according to claim 10, wherein the latch means has a reset means which resets the data stored in the larch means and forces the output of the latch means to be a predetermined logical level.

12. An interface circuit for semiconductor devices according to claim 11, wherein the input signal is an address input signal, and the output of the latch means is a pair of complementary internal address signals.

13. An interface circuit for semiconductor devices comprising:
- a plurality of differential amplifiers each of which outputs a pair of differential signals and each of which changes the potential of one of said pair of differential signals in response to an input signal whereby a plurality of changed ones of the pairs of differential signals are provided; and
- a latch means which receives a plurality of the pairs of differential signals and latches a combination comprised of said plurality of changed ones of the pairs of differential signals.

14. An interface circuit for semiconductor devices according to claim 13,
- wherein the differential amplifier has an activation/inactivation means which performs an activation operation to generate a potential difference between said pair of differential signals and an inactivation operation to make the potentials of said pair of differential signals equal.

15. An input circuit for semiconductor devices according to claim 14, wherein the activation/inactivation means is a means for turning on and off power of the differential amplifier.

16. An interface circuit for semiconductor devices according to claim 13,
- wherein the differential amplifier changes the potential of said one of said pair of differential signals in response to said input signal without simultaneously changing the potential of said other of said pair of differential signals, and
- wherein said latch means detects and latches said one of said pair of differential signals without being supplied with any latch clock signals.

17. An interface circuit for semiconductor devices according to claim 16,
- wherein the differential amplifier has an activation/inactivation means which performs an activation operation to generate a potential difference between said pair of differential signals and an inactivation operation to make the potentials of said pair of differential signals equal.

18. An interface circuit for semiconductor devices according to claim 17,
- wherein the activation/inactivation means is a means for turning on and off power of the differential amplifier.

19. An interface circuit for semiconductor devices according to claim 18,
- wherein the latch means has a reset means which resets the data stored in the latch means and forces the output of the latch means to be a predetermined logical level.

20. An interface circuit for semiconductor devices comprising:
- a plurality of sets of differential amplifier and latch means, the differential amplifier being adapted to output a pair of differential signals in response to an input signal, the latch means being adapted to detect, latch and output one of said pair of differential signals that has changed first; and
- a means for activating/inactivating each of the differential amplifiers in response to a multiplexed signal to a common input terminal of the differential amplifiers.

21. An interface circuit for semiconductor devices according to claim 20, wherein the input signal supplied to the differential amplifiers is a time-division address-multiplexed signal and the output of each latch means is a pair of complementary internal address signals.

22. An interface circuit for semiconductor devices comprising:
- a differential amplifier which outputs a pair of differential signals in response to an address input signal;
- an address counter which has a means for converting an input into a pair of complementary output signals;
- a mode switch means which switches between a normal operation mode for enabling the paired outputs from the differential amplifier and a refresh mode for enabling the paired outputs from the address counter; and
- a latch means which receives the paired outputs from the differential amplifier and the paired outputs from the address counter and which latches one of the paired outputs enabled by the mode switch means that has changed first and produces a pair of complementary internal address signals at its output.

23. An interface circuit for semiconductor devices comprising:

a differential amplifier that has a first input terminal to receive an input signal, a pair of first output terminals to output a pair of signals, and a control terminal to make said differential amplifier active or inactive; and a latch circuit that has a pair of second input terminals receiving said pair of signals received from said differential amplifier, and a second output terminal to output data stored in said latch circuit, wherein the potentials of said pair of signals are held at a predetermined logical level when an inactive signal is supplied to said control terminal, wherein the potential of one of said pairs of signals is changed and the potential of the other of said pair of signals is held at said predetermined logical level in response to said input signal supplied from said first input terminal when an active signal is supplied to said control terminal, and wherein said latch circuit detects the changed potential of said one of said pair of signals, and latches and outputs the detected signal from said second output terminal.

24. An interface circuit for semiconductor devices according to claim 23, wherein the latch circuit has a reset terminal to force data stored in said latch circuit to reset.

25. An interface circuit for semiconductor devices according to claim 24, wherein the first input terminal receives an address input signal, and said second output terminal outputs a pair of complementary internal address signals.

26. An interface circuit according to claim 23, wherein said latch circuit for semiconductor devices detects and latches said one of said pair of signals without being supplied with any latch clock signals.

27. An interface circuit for semiconductor devices comprising:

a differential amplifier that outputs a pair of differential signals and changes the potential of one of said pair of differential signals in response to an input signal; and a latch means that detects one of said pair of differential signals that has changed first, and latches and outputs the detected signal, wherein the differential amplifier changes the potential of said one of said pair of differential signals in response to said input signal without simultaneously changing the potential of the other of said pair of differential signals, and wherein said latch means detects and latches said one of said pair of differential signals without being supplied with any latch clock signals.

28. An interface circuit for semiconductor devices according to claim 27, wherein the differential amplifier has an activation/inactivation means which performs an activation operation to generate a potential difference between said pair of differential signals and an inactivation operation to make the potentials of said pair of differential signals equal.

29. An interface circuit for semiconductor devices according to claim 28, wherein the activation/inactivation means is a means for turning on and off power of the differential amplifier.

30. An interface circuit for semiconductor devices according to claim 29, wherein the latch means has a reset means which resets the data stored in the larch means and forces the output of the latch means to be a predetermined logical level.

31. An interface circuit for semiconductor devices according to claim 30, wherein the input signal is an address input signal, and the output of the latch means is a pair of complementary internal address signals.

32. An interface circuit for semiconductor devices comprising:

a differential amplifier that outputs a pair of differential signals and changes the potential of one of said pair of differential signals in response to an input signal; and a plurality of latch means each of which detects one of said pair of differential signals that has changed first, and latches and outputs the detected signal, wherein the differential amplifier and the plurality of latch means are so connected and arranged that said pair of differential signals are commonly input to the plurality of latch means, wherein the differential amplifier changes the potential of said one of said pair of differential signals in response to said input signal without simultaneously changing the potential of the other of said pair of differential signals, and wherein said latch means detects and latches said one of said pair of differential signals without being supplied with any latch clock signals.

33. An interface circuit for semiconductor devices according to claim 32, wherein the differential amplifier has an activation/inactivation means which performs an activation operation to generate a potential difference between said pair of differential signals and an inactivation operation to make the potentials of said pair of differential signals equal.

34. An interface circuit for semiconductor devices according to claim 33, wherein the activation/inactivation means is a means for turning on and off power of the differential amplifier.

35. An interface circuit for semiconductor devices according to claim 34, wherein the latch means has a reset means which resets the data stored in the larch means and forces the output of the latch means to be a predetermined logical level.

36. An interface circuit for semiconductor devices according to claim 35, wherein the input signal is an address input signal, and the output of the latch means is a pair of complementary internal address signals.

37. An interface circuit for semiconductor devices according to claim 29, wherein said means for turning on and off power of the differential amplifier comprises a switch coupled to a current source of the differential amplifier.

38. An interface circuit for semiconductor devices according to claim 34, wherein said means for turning on and off power of the differential amplifier comprises a switch coupled to a current source of the differential amplifier.

* * * * *